(12) United States Patent
Izumi et al.

(10) Patent No.: US 6,864,936 B2
(45) Date of Patent: Mar. 8, 2005

(54) ACTIVE MATRIX SUBSTRATE, METHOD OF MANUFACTURING THE SAME, AND DISPLAY AND IMAGE-CAPTURING DEVICES UTILIZING THE SAME

(75) Inventors: Yoshihiro Izumi, Kashihara (JP); Yoshimasa Chikama, Soraku-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/774,858

(22) Filed: Jan. 31, 2001

(65) Prior Publication Data

US 2001/0019374 A1 Sep. 6, 2001

(30) Foreign Application Priority Data

Feb. 25, 2000 (JP) ........................................ 2000-049969
Oct. 20, 2000 (JP) ........................................ 2000-321713

(51) Int. Cl.[7] ........................ G02F 1/1343; G02F 1/136; H01L 29/04
(52) U.S. Cl. ........................ 349/139; 349/43; 349/147; 257/59
(58) Field of Search ........................ 349/42, 43, 139, 349/147; 257/59, 72

(56) References Cited

U.S. PATENT DOCUMENTS

| | | | | |
|---|---|---|---|---|
| 5,045,235 A | * | 9/1991 | Ohara et al. | 252/501.1 |
| 5,166,085 A | * | 11/1992 | Wakai et al. | 257/59 |
| 5,446,569 A | * | 8/1995 | Iwai et al. | 349/124 |
| 5,923,390 A | * | 7/1999 | Jung Mok et al. | 349/147 |
| 5,953,084 A | * | 9/1999 | Shimada et al. | 349/38 |
| 6,052,162 A | | 4/2000 | Shimada et al. | 349/38 |
| 6,081,308 A | * | 6/2000 | Jeong et al. | 257/59 |
| 6,198,516 B1 | * | 3/2001 | Kim et al. | 349/39 |
| 6,243,146 B1 | * | 6/2001 | Rho et al. | 257/59 |
| 6,344,888 B2 | * | 2/2002 | Yasukawa | 349/113 |
| 6,356,318 B1 | * | 3/2002 | Kawahata | 349/138 |
| 6,373,544 B1 | * | 4/2002 | Hirabayashi | 349/149 |
| 6,490,014 B1 | * | 12/2002 | Ohtani et al. | 349/38 |

FOREIGN PATENT DOCUMENTS

JP          04232922 A       8/1992       ......... G02F/1/1343

* cited by examiner

Primary Examiner—Tarifur R. Chowdhury
(74) Attorney, Agent, or Firm—Edwards & Angell, LLP; David G. Conlin; George W. Hartnell, III (57) ABSTRACT

An active matrix substrate includes: electrode wires constituted by gate electrodes 2 and source electrodes 6 that are arranged in a lattice; an insulating protection film provided at least on the electrode wires so as to have openings 11a in predetermined areas on the source electrodes 6; and a metal layer stacked on the source electrodes 6 in the openings 11a. Since there is a metal layer stacked on the source electrodes 6, the source electrodes 6 can be readily increased in thickness and hence sufficiently reduced in resistance, by means of the metal layer. Thus, the electrode wires become thicker and more conducting. This way, it becomes possible to provide active matrix substrates and their methods of manufacturing that are suitably applicable to, for example, display devices and image-capturing devices.

39 Claims, 7 Drawing Sheets

ACTIVE MATRIX SUBSTRATE, METHOD OF MANUFACTURING THE SAME, AND DISPLAY AND IMAGE-CAPTURING DEVICES UTILIZING THE SAME

FIELD OF THE INVENTION

The present invention relates to active matrix substrates suitably used in flat panel displays (FPDs), such as liquid crystal displays (LCDs), electrochromic displays (ECDs), and electroluminescent displays (ELDs); flat panel sensors (FPSs) such as X-ray image-capturing devices; and other various devices, and also to methods of manufacturing such substrates, and display and image-capturing devices utilizing such substrates

BACKGROUND OF THE INVENTION

Active matrix substrates are conventionally known that include (i) X-Y matrix electrode wires constituted by scanning electrodes and signal electrodes arranged to form a lattice and (ii) switching elements, such as TFTs (thin film transistors), provided at the crossings where electrode wires cross, so as to scan drive the switching elements sequentially, one scanning electrode at a time. Such active matrix substrates are used in various applications including flat panel displays and flat panel sensors to take advantage of their flatness, high driving capability, and other superior features.

Figures 6A, 6B:
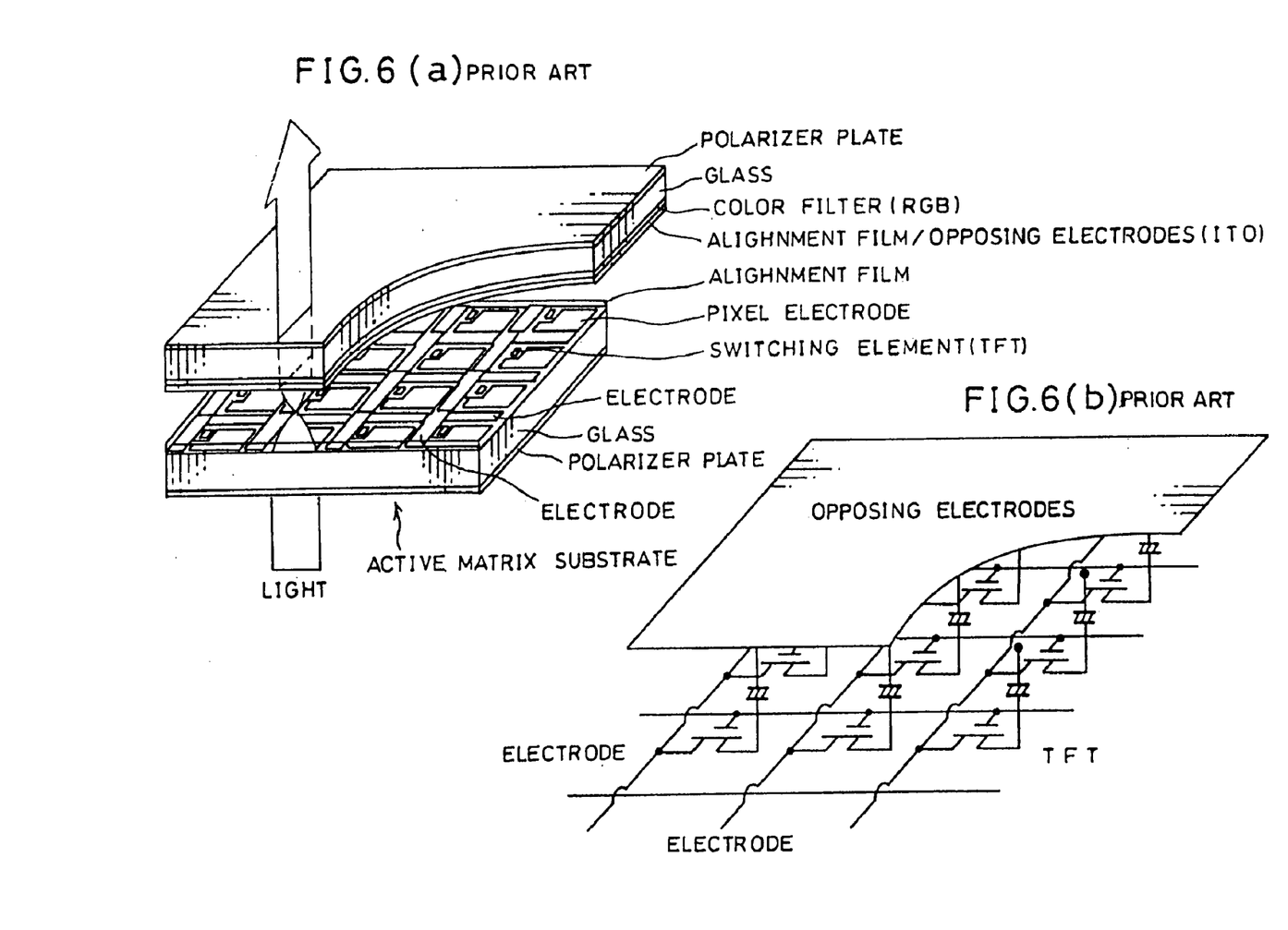
FIG. 6(a) is an exploded view schematically showing an arrangement of a typical crystal display device of an active matrix type.
FIG. 6(b) is an diagram of an equivalent circuit, schematically illustrating an arrangement of a typical crystal display device of an active matrix type.
Figure 7:
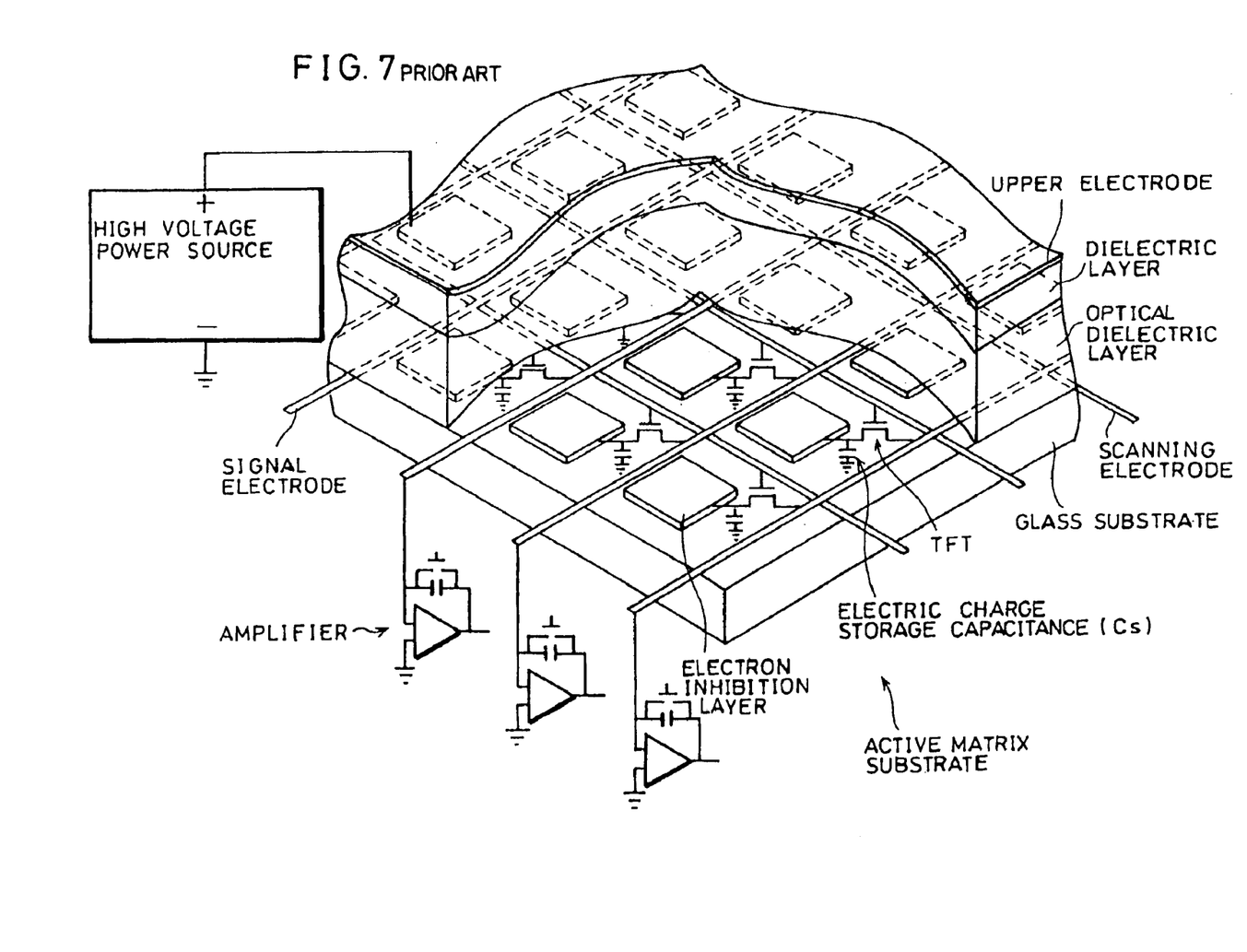
FIG. 7 is an explanatory view showing an arrangement schematically showing a typical X-ray sensor of a flat panel type.

A specific example is shown in FIGS. 6(a) and 6(b) depicting a liquid crystal display of an active matrix type made up of active matrix substrates together with liquid crystal which is an electro-optical medium. The display has found a wide variety of applications in many fields such as office automation and audio visual equipment. FIG. 7 shows another example, depicting an X-ray sensor of a flat panel type, currently under development, made of the active matrix substrate together with a photoconductor for converting X-ray energy into electric charges. The X-ray sensor readily provides X-ray image data in digital form and delivers a capability to take moving pictures. Researches are thus eagerly conducted to develop X-ray sensors which could replace X-ray films.

However, in the flat panel display, the flat panel sensor, etc., an attempt to increase the display area or precision would require higher drive frequencies and cause a greater resistance and parasitic capacitance to develop in electrode wires (bus lines) on an active matrix substrate. For example, in the flat panel display, a greater resistance and parasitic capacitance in the electrode wire undesirably delays a drive signal and introduces non-uniformity in the displayed image. In the flat panel sensor, a greater resistance and parasitic capacitance in the electrode wire undesirably leads to deterioration in the S/N ratio of a reading signal which is picked up through a signal electrode to read a weak signal produced by the photoconductor.

To solve these problems by way of reducing the resistance in the electrode wire, the electrode wire is made of relatively low resistance aluminum and with an increased thickness.

However, typically, the electrode wire on the active matrix substrate is formed by first depositing a metal thin film on the substrate using a vacuum film forming device that can perform vacuum vapor deposition, such as sputter vapor deposition, and then etching out a predetermined wiring geometry (pattern). Therefore, an increase in the thickness of the electrode wire by way of the foregoing techniques entail the following problems.

(1) A typical vacuum film forming device can handle a single wafer at a time and must sacrifice its throughput (performance) to form thicker electrode wires, which brings down the productivity in producing active matrix substrates.
(2) Since a metal thin film must be deposited on the entire surface of the substrate before removing unnecessary parts by etching, etching a relatively thick metal film is a time consuming process and produces large amounts of removed waste metal (material).

For these reasons, in view of productivity, cost, and other contributing factors, the conventional techniques are both difficult and impractical to provide electrode wires with over a 500 nm thickness (to increase the thickness of the deposited film). In other words, the conventional techniques have problems such that it is very difficult in practice to increase the thickness of the electrode wire on the active matrix substrate for reduction in the resistance of the electrode wire and eventually to increase the display area and precision of the flat panel display and flat panel sensor.

SUMMARY OF THE INVENTION

A first objective of the present invention is to prevent increases in the amounts of wasted metal, reduce the resistance of electrode wires on the active matrix substrate by increasing the thickness of the film which constitutes the electrode wires without causing a drop in productivity, and thereby attempt to increase the display area and precision of the flat panel display, the flat panel sensor, etc., that is, to offer an active matrix substrate that is suitably used in these devices and also offer a method of manufacturing such an active matrix substrate.

A second objective of the present invention is to offer a display device and an image-capturing device incorporating the substrate.

An active matrix substrate in accordance with the present invention, in order to achieve the above objectives, is characterized in that it includes:

electrode wires constituted by scanning electrodes and signal electrodes that are arranged in a lattice;

an insulating film provided at least on the electrode wires so as to have openings in predetermined areas at least either on the scanning electrodes or on the signal electrodes; and a metal layer stacked on the electrodes in the openings.

With the arrangement, there is provided a metal layer stacked at least either on the scanning electrodes or on the signal electrodes; therefore, at least either the scanning electrodes or the signal electrodes are increased in thickness, by means of the metal layer. Thereby, active matrix substrates can be made with the resistance of the electrode wires being sufficiently reduced.

A display device in accordance with the present invention, in order to achieve the above objectives, is characterized in that it includes:

an active matrix substrate; and an electro-optical medium driven by the active matrix substrate, the active matrix substrate including: electrode wires constituted by scanning electrodes and signal electrodes that are arranged in a lattice; an insulating film provided at least on the electrode wires so as to have openings in predetermined areas at least either on the scanning electrodes or on the signal electrodes; and a metal layer stacked on the electrodes in the openings.

With the arrangement, the display device includes an active matrix substrate that is reduced sufficiently in the resistance of the electrode wires. Therefore, delays in drive signals can be restrained when an attempt is made to increase the display area and precision of the display device; no uniformity is lost in a display. In other words, a display device with a large display area and high precision can be provided without causing a delay in the drive signals.

An image-capturing device in accordance with the present invention, in order to achieve the above objectives, is characterized in that it includes:

an active matrix substrate; and a photoconductor of which electric charge is read by the active matrix substrate the active matrix substrate including: electrode wires constituted by scanning electrodes and signal electrodes that are arranged in a lattice; an insulating film provided at least on the electrode wires so as to have openings in predetermined areas at least either on the scanning electrodes or on the signal electrodes; and a metal layer stacked on the electrodes in the openings.

With the arrangement, the image-capturing device includes an active matrix substrate that is reduced sufficiently in the resistance of the electrode wires. Therefore, a small quantity of electric charge that develops in the photoconductor can be read, while ensuring a sufficient level of S/N ratios. Also, with the arrangement, delays in drive signals can be restrained when an attempt is made to increase the display area (display area size) and precision of the image-capturing device. In other words, a small quantity of electric charge can be read out, while ensuring a sufficient level of S/N ratios. Also, image-capturing device with a large display area and high precision can be provided without causing a delay in the drive signals.

A method of manufacturing an active matrix substrate in accordance with the present invention, in order to achieve the above objectives, is characterized in that it includes the steps of:

(a) forming scanning electrodes and signal electrodes, for acting as electrode wires, arranged in a lattice on a substrate;

(b) forming an insulating film at least on the electrode wires so as to have openings in predetermined areas at least either on the scanning electrodes or on the signal electrodes; and (c) forming a metal layer selectively in the openings on the electrodes.

With the arrangement, a metal layer is selectively formed only on the electrodes in the openings that are cut out of the insulating film; therefore, a conventional step is no longer necessary in which etching is done (etching step) following each predetermined patterning in the formation of the metal layer. Further, since no etching steps are required, increases in thickness of the metal layer cause only a restrained increase in the quantity of wasted metal. Therefore, an active matrix substrate can be readily manufactured at low cost with the resistance of the electrode wires being sufficiently reduced.

For a fuller understanding of the nature and advantages of the invention, reference should be made to the ensuing detailed description taken in conjunction with the accompanying drawings.

DESCRIPTION OF THE EMBODIMENTS

Embodiment 1

Figure 1:
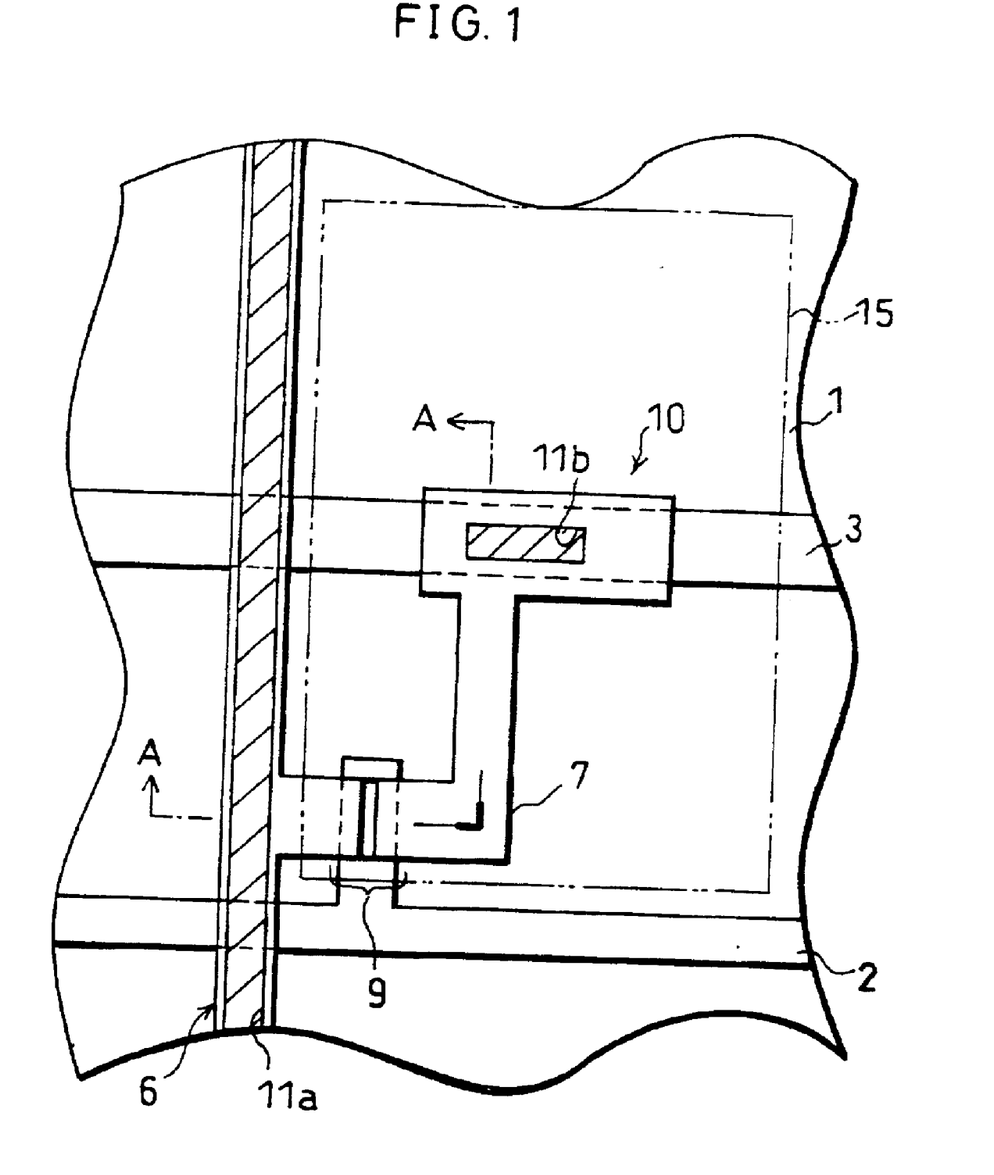
FIG. 1 is a plan view schematically showing an arrangement of a pixel which constitutes a main part of an active matrix substrate in accordance with an embodiment of the present invention.

Referring to FIG. 1 and FIG. 2, the following description will discuss an embodiment of the present invention. Note that in the following, an active matrix substrate will be explained, as an example, which includes an arrangement such that an insulating film has an opening in a predetermined area on a signal electrode.

Figure 2A:
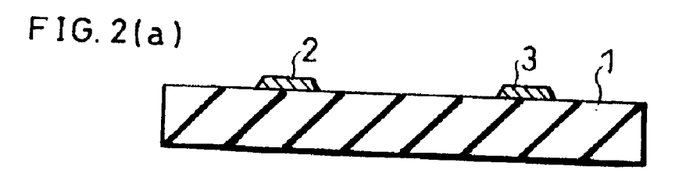
FIG. 2(a) is a cross-sectional view taken along line A—A of FIG. 1, illustrating a manufacturing step of the pixel.
Figure 2B:
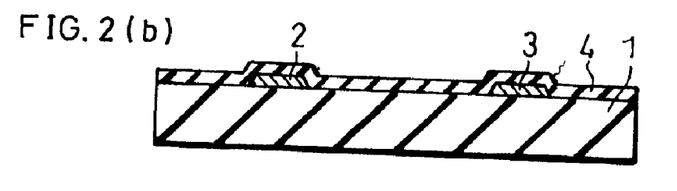
FIG. 2(b) is a cross-sectional view taken along line A—A of FIG. 1, illustrating a manufacturing step of the pixel.
Figure 2C:
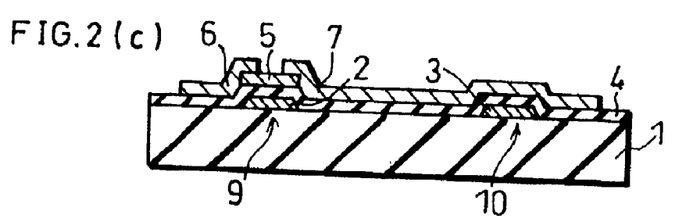
FIG. 2(c) is a cross-sectional view taken along line A—A of FIG. 1, illustrating a manufacturing step of the pixel.
Figure 2D:
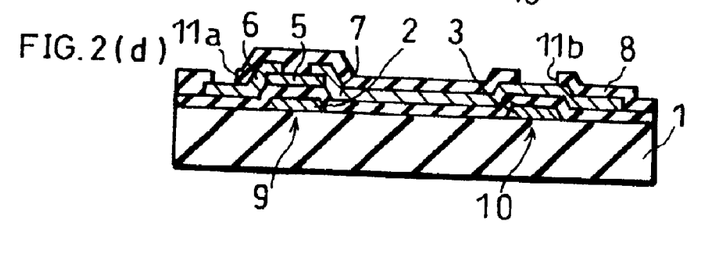
FIG. 2(d) is a cross-sectional view taken along line A—A of FIG. 1, illustrating a manufacturing step of the pixel.
Figure 2E:
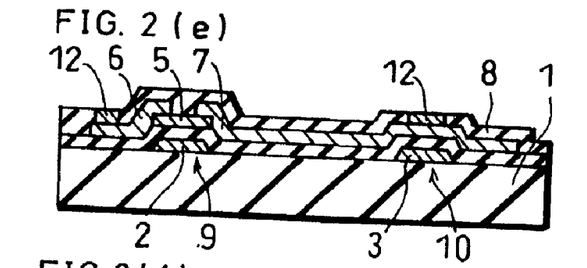
FIG. 2(e) is a cross-sectional view taken along line A—A of FIG. 1, illustrating a manufacturing step of the pixel.
Figure 2F:
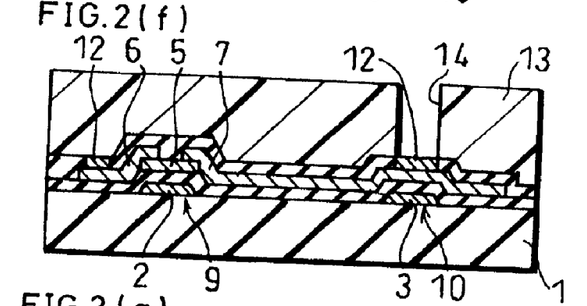
FIG. 2(f) is a cross-sectional view taken along line A—A of FIG. 1, illustrating a manufacturing step of the pixel.
Figure 2G:
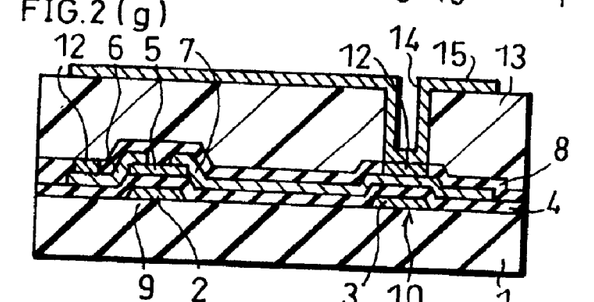
FIG. 2(g) is a cross-sectional view taken along line A—A of FIG. 1, illustrating a manufacturing step of the pixel.

An active matrix substrate in accordance with the present embodiment, as shown in FIG. 1 and FIG. 2(g), includes gate electrodes (scanning electrodes) 2, storage capacitance electrodes (Cs electrodes) 3, a gate insulating film (dielectric layer) 4, a semiconductor layer 5, source electrodes (signal electrodes) 6, drain electrodes 7, an insulating protection film (insulating film) 8, a metal layer 12, an interlayer insulating film 13, pixel electrodes 15, and other components which are formed in layers on an insulating substrate 1. A gate electrode 2, a source electrode 6, and a drain electrode 7, together with the gate insulating film 4, the semiconductor layer 5, etc. constitute a TFT (thin film transistor) element 9 which is a switching element. A storage capacitance electrode 3 and a drain electrode 7, together with the gate insulating film 4 and other components, constitute an electric charge storage capacitance (Cs) 10. Accordingly, each source electrode 6 has a linear portion which acts as a signal line and an extended portion which constitutes a part of a TFT element 9, and each drain electrode 7 is provided so as to couple a TFT element 9 to an electric charge storage capacitance 10. The insulating substrate 1 is suitably made of glass or plastic, for instance; however, there are no particular requirements.

Electrode wires are constituted by the gate electrodes 2 and the source electrodes 6 which are provided (arranged) to form a lattice on the insulating substrate 1. A TFT element 9 is provided at every crossing of the electrode wires arranged in a lattice (at every point in lattice). The pixel electrodes 15 are provided in great numbers to form a matrix and connected to the source electrodes 6 via the TFT elements 9. A pixel containing layer is constituted by these electrode wires, the TFT elements 9, the pixel electrodes 15, etc. The active matrix substrate is constituted by the pixel containing layer and other components provided on the insulating substrate 1.

The gate electrodes 2 and the storage capacitance electrodes 3 can be made of aluminum, molybdenum, tantalum, or an alloy that contains at least one of these metals as a main component, for instance. Alternatively, the gate electrodes 2 and the storage capacitance electrodes 3 can be made of ITO (Indium-Tin Oxide layer) or $SnO_2$ (oxidized tin layer), which would form a transparent conducting oxide film. The gate electrodes 2 and the storage capacitance electrodes 3 can be etched out in a desired pattern from a metal film provided by sputter vapor deposition, electroless plating (chemical plating), or another technique, for instance. Acceptable thicknesses of the metal film are approximately in a range of 200 nm to 400 nm; however, there are no particular requirements. In view of facilitating manufacturing process, the gate electrodes 2 and the storage capacitance electrodes 3 are preferably made of an identical material in a single step.

The gate insulating film 4 can be made of SiNx, SiOx, TaOx, or the like. Alternatively, the gate insulating film 4 may be made of stacked layers each of which is composed of one of these materials. The gate insulating film 4 is provided by forming a film of one of the materials by CVD (Chemical Vapor Deposition), anode oxidation, or another technique, for instance. Acceptable thicknesses of the film are approximately in a range of 200 nm to 500 nm; however, there are no particular requirements. The gate insulating film 4 is provided to cover the gate electrodes 2 and the storage capacitance electrodes 3, so that the portions on the gate electrodes 2 can act as a gate insulating film in the TFT elements 9 and the portions on the storage capacitance electrodes 3 can act as a dielectric layer in the electric charge storage capacitances 10.

The semiconductor layer 5 can be made of a-Si (amorphous silicon), p-Si (polycrystalline silicon), or CdSe, for instance. The semiconductor layer 5, if made of, for instance, a-Si, is provided by depositing an a-Si film by CVD. Acceptable thicknesses of the film is approximately in a range of 30 nm to 100 nm; however, there are no particular requirements. To form channels for the TFT elements 9, the semiconductor layer 5 is provided over the gate electrodes 2, that is, on the gate insulating film 4 where the TFT elements 9 are formed.

The source electrodes 6 and the drain electrodes 7 can be made of aluminum, molybdenum, tantalum, or an alloy that contains at least one of these metals as a main component, for instance. Alternatively, the source electrodes 6 and the drain electrodes 7 can be made of ITO (Indium-Tin Oxide layer) or $SnO_2$ (oxidized tin layer), which would form a transparent conducting oxide film. The source electrodes 6 and the drain electrodes 7 can be etched out in a desired pattern from a metal film provided by sputter vapor deposition, or another technique, for instance. The formation technique is suitable to manufacture of large, precise active matrix substrates. Alternatively, the source electrodes 6 and the drain electrodes 7 can be etched out in a desired pattern from an ITO film provided by sputter vapor deposition or an apply-and-bake technique utilizing a sol-gel material, for instance. Acceptable thicknesses of the metal and ITO films are approximately in a range of 100 nm to 200 nm; however, there are no particular requirements. The electric charge storage capacitances 10 are formed where the drain electrodes 7 are stacked on the storage capacitance electrodes 3. In view of facilitating manufacturing process, the source electrodes 6 and the drain electrodes 7 are preferably made of an identical material in a single step. An $n^+$ a-Si layer is preferably provided as a contact layer between (on the interface between) the semiconductor layer 5 and the source and drain electrodes 6 and 7.

The insulating protection film 8 is provided on the electrodes 6 and 7, that is, on the substantially entire surface (substantially entire area) of the insulating substrate 1 on which the TFT elements 9, the electric charge storage capacitance 10, and other components are formed. The insulating protection film 8 can be made of SiNx, SiOx, a polyimide resin, or an acrylic resin, for instance. Alternatively, the insulating protection film 8 may be made of stacked layers each of which is composed of one of these materials. The insulating protection film 8, if made of, for instance, SiNx, is provided by depositing a SiNx film by CVD. Acceptable thicknesses of the film is approximately 300 nm; however, there are no particular requirements.

The insulating protection film 8 has openings 11a provided at predetermined positions, i.e., on the linear portions of the source electrodes 6 (in predetermined areas on the signal electrodes, shown as hatched regions in FIG. 1) and openings 11b provided at predetermined positions, i.e., on portions of the drain electrodes 7 where no TFT elements 9 are provided (shown as hatched regions in FIG. 1). In other words, the openings 11a are formed (cut out) in stripes along the source electrodes 6 on the other portions of the source electrodes 6 than the extended portions where the TFT elements 9 are provided. Further, the openings 11b are formed on portions of the drain electrodes 7 where no TFT elements 9 are provided, preferably, on portions of the drain electrodes 7 where the electric charge storage capacitances 10 are provided.

The openings 11a and 11b are etched through an insulating protection film according to a predetermined resist pattern provided thereon so as to remove unnecessary parts of the insulating protection film (those parts where the openings are made on the electrodes 6 and 7). In the openings 11a, the underlying source electrodes 6 are exposed. In the openings 11b, the underlying drain electrodes 7 are exposed. The openings 11a may come in any size as long as they do not exceed the dimensions of the linear portions of the source electrodes 6. The openings 11b may come in any size as long as they do not exceed the dimensions of portions of the drain electrodes 7 where no TFT elements 9 are provided, or preferably, the dimensions of the electric charge storage capacitances 10.

The metal layer 12 is formed on the source electrodes 6 and the drain electrodes 7 to cap the openings 11a and 11b. The metal layer 12 is provided for the purpose of reducing the resistance of the underlying electrodes 6 and 7 (form low resistance electrodes 6 and 7). The metal layer 12 can be made of nickel, copper, gold, or an alloy that contains at least one of these metals as a main component, for instance.

Particularly suitable among them are copper and gold which exhibit a low specific resistance (a low resistance). Copper offers the most suitable choice in view of its low cost. Further, the metal layer 12, if made of nickel, exhibits improved adhesion to the underlying electrodes 6 and 7.

The metal layer 12 is provided by forming a metal film by, for example, wet plating, i.e., electroless plating or electric plating. This facilitates an attempt to increase the thickness of the metal layer 12. Also, this makes it possible to form the metal layer 12 (to form a film) by batch processing, and thereby prevent a drop in throughput (performance). Further, the metal layer 12 can be selectively provided only on the electrodes 6 and 7 at the bottoms of the openings 11a and 11b (plating film formation). Therefore, even if the metal layer 12 is made relatively thick, the metal is not wasted in large amounts. To greatly reduce the resistance of the electrodes 6 and 7, acceptable thicknesses of the metal are approximately in a range of 200 nm to 1000 nm; however, the thickness only needs to specified according to the thickness of the insulating protection film 8 and other factors, and there are no particular requirements.

If the metal layer 12 is to be provided by electroless plating, a plating catalyst and an electroless plating liquid are used. A suitable plating catalyst is a palladium catalyst.

For instance, a copper film formed by electroless plating exhibits a specific resistance of 2 $\mu\Omega$cm. In contrast, for example, an aluminum film formed by conventional sputter vapor deposition exhibits a specific resistance of 4 $\mu\Omega$cm. Therefore, if copper and aluminum films are formed with an identical thickness, the copper layer has a sheet resistance half that of the aluminum layer. That is, the metal layer 12 now has half the original sheet resistance. Further, a comparison of a 900-nm-thick copper film formed by electroless plating with a 300-nm-thick aluminum film formed by sputter vapor deposition shows that the copper layer has a sheet resistance one-sixth (⅙) that of the aluminum layer. This way, the sheet resistance of the metal layer 12 can be reduced to ⅙. The metal layer 12, when formed by electroless plating, makes it possible to attempt to increase the thicknesses of the source electrodes 6 and the drain electrodes 7 without a drop in throughput (performance) and also to prevent increases in the amounts of wasted metal. Consequently, increases in thickness of the electrodes 6 and 7 can be more readily attempted, and the resistances of the electrodes 6 and 7 can be reduced to sufficient levels, compared to conventional sputter vapor deposition. In other words, the active matrix substrate in accordance with the present embodiment includes a metal layer 12 formed by the foregoing technique, and thereby has source electrodes 6 and drain electrodes 7 with sufficiently reduced resistances.

When the source electrodes 6 and the drain electrodes 7 are made of ITO, and the metal layer 12 is made of copper, an about 200-nm-thick nickel film may be interposed between (on the interface between) the ITO and the copper film to further improve adhesion of the underlying electrodes 6 and 7 to the metal layer 12. A nickel film exhibits high adhesive nature with ITO and can be formed by electroless plating. Nickel selectively deposits on ITO to which a palladium catalyst or another plating catalyst adheres. To further improve the adhesion of the nickel film and the copper film, an about 10-nm- to 30-nm-thick gold film can be provided on the surface of the nickel film. Gold can be deposited by means of substitution plating, replacing nickel. This technique is available to form a gold film. In this event, a copper film can be made using gold as the plating catalyst. Specifically, to form a copper film after depositing a nickel film and a gold film on ITO, predetermined places can be selectively plated by the effects of a plating catalyst, and the individual layers (films) can be hence readily formed. Thus, the structure including the three layers can be readily formed without an additional patterning process. As described so far, the metal layer 12 only needs to contain at least one metal film selected from a group consisting a nickel film, a copper film, and a gold film. More specifically, the metal layer 12 may be a single layer film made of copper, for instance. Alternatively, the metal layer 12 may include a plurality of layers constituted by a copper film and a nickel film or by a copper film, a nickel film, and a gold film.

Further examples of the metal layer 12 may include a silver film formed by electroless plating or a plurality of layers constituted by a copper film and a silver film deposited thereon. Also, the metal layer 12 may be a plurality of layers constituted by a nickel film, a silver film, and the like which are formed on the surface of the ITO as the electrodes 6 and 7 by electroless plating and a copper film which is formed on top of those films by electric plating. The metal layer 12 may also be a copper or another metal film formed by electric plating. If the metal layer 12 is to be formed by electric plating, an electric plating liquid is used.

The interlayer insulating film 13 can be made of a photosensitive resin, such as a polyimide resin or an acrylic resin. The interlayer insulating film 13 is provided by forming a resin film by coating, for instance. Acceptable thicknesses of the resin film is approximately in a range of 1000 nm to 4000 nm; however, there are no particular requirements. A contact hole 14 is formed at predetermined parts of the interlayer insulating film 13 in which the drain electrodes 7 is short-circuited with the pixel electrodes 15 through the metal layer 12. If the interlayer insulating film 13 is to be made of a photosensitive resin, an interlayer insulating film 13 with contact holes 14 can be easily made, by applying a photosensitive resin on an insulating protection film 8 and subsequently subjecting the resin to exposure, development, and other predetermined patterning steps. The metal layer 12 formed on the source electrodes 6 is covered with the interlayer insulating film 13, as well as the insulating protection film 8, and is therefore protected by the interlayer insulating film 13.

The pixel electrodes 15 can be made of ITO, which is a transparent conducting oxide film, for instance, when the active matrix substrate is used in a transparent type display device, and can be made of highly reflective aluminum, silver, or another metal formed in film when the active matrix substrate is used in a reflection-type display device. When the active matrix substrate is used in an image-capturing device, the pixel electrodes 15 can be made from a film of various conducting materials, such as a low resistance, doped semiconductor film, as well as above ITO, aluminum, silver, or another metal film. The pixel electrodes 15 can be etched out in a desired pattern from a film made of one of the foregoing materials provided by sputter vapor deposition, or another technique, for instance. Acceptable thicknesses of the film is approximately in a range of 100 nm to 300 nm; however, there are no particular requirements. The interlayer insulating film 13 prevents the pixel electrodes 15 from short-circuiting to a metal layer 12 formed on the source electrodes 6 and static electricity capacity from increasing. The pixel electrodes 15 may be formed not to overlap the linear portions of the gate electrodes 2 and the source electrodes 6 as shown in FIG. 1, and alternatively, formed so as to overlap the electrodes 2 and 6 to increase the integration of pixel electrodes.

Now, in reference to FIG. 2(a) to FIG. 2(g), the following will explain, as an example, a method of manufacturing an active matrix substrate of the foregoing arrangement. The example is never intended to limit the method of manufacturing an active matrix substrate in any manner.

Initially, as shown in FIG. 2(a), a metal film is formed on the insulating substrate 1 by sputter vapor deposition or electroless plating and then patterned into a desired shape to form the gate electrodes 2 and the storage capacitance electrodes 3 (step 1). So, the gate electrodes 2 and the storage capacitance electrodes 3 are made of an identical material in a single step.

Next, as shown in FIG. 2(b), a gate insulating film 4 is formed by providing a film of SiNx or another material on the insulating substrate 1 by CVD or anodization so that the resultant film covers the gate electrodes 2 and the storage capacitance electrodes 3 (step 2).

Subsequently, as shown in FIG. 2(c), a semiconductor layer 5 is formed on a part of the gate insulating film 4 where a TFT elements 9 will be formed by providing a film of a-Si or another material by CVD or another technique. On the semiconductor layer 5, source electrodes 6 and drain electrodes 7 are formed by providing a metal film and or another film by sputter vapor deposition or another technique and patterning the film into a desired shape (step 3). That is, the source electrodes 6 and the drain electrodes 7 are made of an identical material in a single step. This way, electrode wires constituted by the gate electrodes 2 and the source electrodes 6, as well as the TFT elements 9 and the electric charge storage capacitances 10, are formed. Note that in the following an example will be taken in which the source electrodes 6 and the drain electrodes 7 are made of ITO.

Then, as shown in FIG. 2(d), an insulating protection film 8 with openings 11a and 11b is formed by providing a 300-nm thick film of SiNx or another material on the electrodes 6 and 7, that is, on the substantial entirety of the surface of the insulating substrate 1, by CVD or another technique, then patterning the film into a desired shape, then etching the film (step 4). Note that in the following an example will be taken in which the insulating protection film 8 is made of SiNx.

Next, a palladium catalyst (not shown), which is a plating catalyst, is caused to selectively adhere to the bottoms of the openings 11a and 11b, that is, the exposed parts of the surfaces of the source electrodes 6 and the drain electrodes 7 to form a metal layer 12 by electroless plating. That is, the insulating substrate 1, which has undergone the foregoing steps, is immersed in a palladium-catalyst-containing, pH-adjusted solution for a predetermined period of time. As a result of the immersion, the palladium catalyst adheres to the ITO that composes the source electrodes 6 and the drain electrodes 7, but hardly adhere to the SiNx film which acts as an insulating protection film 8. Consequently, the palladium catalyst selectively adheres to the exposed parts of the source electrodes 6 and the drain electrodes 7 only. Thereafter, the insulating substrate 1 is pulled out of the palladium-catalyst-containing solution and washed in water to remove excessive palladium catalyst (step 5).

Note that plating catalyst has a nature of readily adhering to various metals, as well as to ITO. A so-called photosensitive catalyst is also available to cause palladium catalyst to selectively adhere to ITO. In such an event, a catalyst precursor (photosensitive catalyst) from which a palladium catalyst separates out upon exposure is applied on the entire surface (surface) of the insulating substrate 1, which has undergone the foregoing steps, and then the openings 11a and 11b are exposed to light so that the palladium catalyst separates out in the openings 11a and 11b.

Subsequently, the insulating substrate 1, to which the palladium catalyst is adhering as a result of the previous step, is immersed in an electroless plating liquid for a predetermined period of time so that metal separates out selectively on the ITO to which the palladium catalyst is adhering. Since the palladium catalyst is selectively adhering to the ITO in the openings 11a and 11b as a result of the previous step, the metal can be caused to selectively separate out only on the ITO by electroless plating. This way, as shown in FIG. 2(e), a metal layer 12 is formed in the openings 11a and 11b, i.e., on the exposed surface of the source electrodes 6 and the drain electrodes 7 (step 6). Executing steps 5 and 6 eliminates the need for a conventional step in which etching is done (etching step) following each predetermined patterning in the formation of the metal layer 12. Further, since no etching steps are required, increases in thickness of the metal layer 12 cause only a restrained increase in the quantity of wasted metal. Besides, since a metal layer is more readily formed in a batch process by electroless plating than by sputter vapor deposition or another vacuum vapor deposition technique, increases in thickness of the metal layer 12 cause only a restrained drop in throughput (performance). The use of electroless plating enables a uniformly thick metal layer 12 to be formed on an insulating substrate 1 with a large area and also a metal layer 12 to be formed on an isolated pattern. If a nickel or another metal film is to be further stacked on the ITO, the metal is caused to selectively separate out on the ITO prior to step 6 similarly to step 6 and then step 6 is executed to form the metal layer 12.

Meanwhile, if a metal layer 12 is to be formed by electric plating in the openings 11a and 11b, i.e., on the exposed surfaces of the source electrodes 6 and the drain electrodes 7, the following step is executed instead of steps 5 and 6. After the immersion of an insulating substrate 1, which has undergone steps 1 to 4, in the electric plating liquid, a step (step 6') is executed of supplying an electric plating power source for a predetermined period of time to the electrodes 6 and 7 and causing copper and other metals to selectively separate out on the exposed parts of the electrodes 6 and 7. Executing step 6' eliminates the need for a conventional step in which etching is done (etching step) following each predetermined patterning in the formation of the metal layer 12. Further, since the execution of step 6' enables the metal layer 12 to be readily formed selectively with no pre-plating steps in which a catalyst is supplied, for example, and eliminates the need for an etching step, increases in thickness of the metal layer 12 cause only a restrained increase in the quantity of wasted metal. Besides, since a metal layer is more readily formed in a batch process by electroless plating than by sputter vapor deposition or another vacuum vapor deposition technique, increases in thickness of the metal layer 12 cause only a restrained drop in throughput (performance). The use of electroless plating enables a fine metal layer 12 to be formed with excellent quality.

Attention needs to be paid to the fact that in electric plating, the thickness of metal that separates out (film thickness) varies depending on current density. Accordingly, if the electrodes 6 and 7 have a high resistance, a voltage drop occurs across the electrodes 6 and 7 according to the distance from a current supply source (terminal) for electric plating, distorting (distributing) the current density during plating. Therefore, if the metal layer 12 is to be formed by electric plating, the source electrodes 6 and the drain electrodes 7 are preferably made of a metal other than ITO.

Next, as shown in FIG. 2(f), a resin is applied on the insulating protection film 8 by a coating technique, for example. The resin then is subjected to exposure, development, and other predetermined patterning steps, to form an interlayer insulating film 13 with contact holes 14 (step 7). Here, those parts of the metal layer 12 that are formed on the source electrodes 6 are covered with an interlayer insulating film 13, while those of the metal layer 12 that are formed on the drain electrodes 7 are exposed in the contact holes 14.

Thereafter, an ITO or other film is formed on the interlayer insulating film 13 by sputter vapor deposition, for example, to form pixel electrodes 15. Here, the pixel electrodes 15 are short-circuited to the drain electrodes 7 via the metal layer 12 in the contact holes 14 provided in the interlayer insulating film 13 (step 8).

The active matrix substrate with a metal layer 12 is manufactured by sequentially executing steps 1 to 8. However, this example is not the only method of manufacturing the active matrix substrate.

As detailed so far, an active matrix substrate in accordance with the present embodiment has an arrangement including:

electrode wires constituted by gate electrodes 2 and source electrodes 6 that are arranged in a lattice;

an insulating protection film 8 provided at least on the electrode wires so as to have openings 11a in predetermined areas on the source electrodes 6; and a metal layer 12 stacked on the source electrodes 6 in the openings 11a.

With the arrangement, a metal layer 12 is stacked on the source electrodes 6. The provision of the metal layer 12 facilitates an attempt to make the source electrodes 6 thicker and thereby sufficiently reduce the resistance of the electrode wires. The active matrix substrate having the arrangement is suitably used for display devices for which demands are high to develop large display areas (large display screens) and high precision, image-capturing devices for which demands are high to read weak signals, and various other devices.

Supposing that the metal layer 12 is made of copper and also that the insulating protection film 8 is made of SiNx by CVD in executing step 6, the copper film decays due to the reaction gas used in CVD (for example, ammonium gas) to form the SiNx film, as long as the copper film (metal layer 12) is formed first before the formation of the SiNx film (insulating protection film 8). However, in the foregoing arrangement, the SiNx film is formed first before the formation of the copper film, which does not cause decay of the copper film. Further, since the SiNx film is formed first before plating the copper film, the TFT elements 9 is protected against a plating agent.

Embodiment 2

Figure 3:
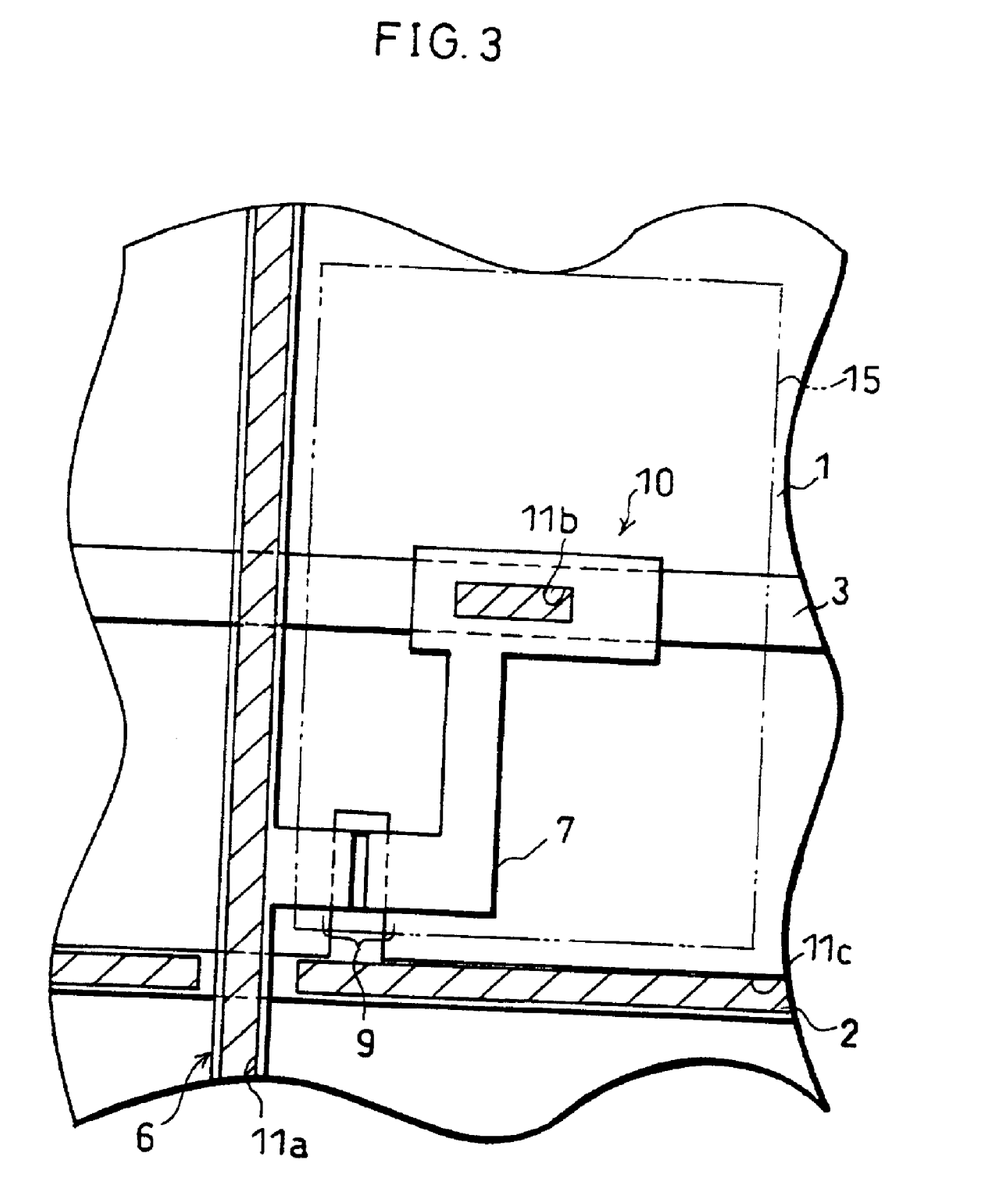
FIG. 3 is a plan view schematically showing an arrangement of a pixel which constitutes a main part of an active matrix substrate in accordance with another embodiment of the present invention.

Referring to FIG. 3, the following description will discuss another embodiment of the present invention. Here, for convenience, members of the present embodiment that have the same arrangement and function as members of embodiment 1, and that are mentioned in that embodiment are indicated by the same reference numerals and description thereof is omitted.

An insulating protection film 8 on an active matrix substrate in accordance with the present embodiment has openings 11a and 11b, as well as openings 11c at predetermined positions shown in FIG. 3, i.e., on linear portions of the gate electrodes 2 (in predetermined areas on the signal electrodes shown as hatched regions in FIG. 3). In other words, the insulating protection film 8 in accordance with the present embodiment has the openings 11a and 11b, as well as the openings 11c that are formed (cut out) in stripes along the gate electrodes 2 on the other portions of the gate electrodes 2 than the extended portions where the TFT elements 9 are provided. The active matrix substrate is (Members in the active matrix substrate are) otherwise arranged identically as the active matrix substrate in accordance with embodiment 1 above.

To fabricate an active matrix substrate arranged as above, steps 4 to 6 in the method of manufacturing an active matrix substrate in accordance with embodiment 1 above are modified as follows. In step 4, films including a SiNx film are formed by, for example, CVD, on a substantially entire surface of the insulating substrate 1 and then subjected to patterning to a desired shape and etching, to complete the fabrication of an insulating protection film 8 with the openings 11a and 11b, as well as the openings 11c. Subsequently, by executing step 5, a palladium catalyst, which acts as a plating catalyst, is caused to selectively adhere in the openings 11a, 11b, and 11c, that is, on the exposed portions of the surfaces of the gate electrodes 2, source electrodes 6, and drain electrodes 7. Then, by executing step 6, the insulating substrate 1 to which the palladium catalyst adheres is immersed in an electroless plating liquid for a predetermined period of time, to form a metal layer 12 on the exposed portions of the surfaces of the gate electrodes 2, source electrodes 6, and drain electrodes 7 by electroless plating. Alternatively, by executing step 6' instead of steps 5 and 6, the metal layer 12 is formed the exposed portions of the surfaces of the gate electrodes 2, source electrodes 6, and drain electrodes 7 by electric plating. This way, an active matrix substrate can be readily fabricated in accordance with the present embodiment without increasing the manufacturing steps.

As described in the foregoing, an active matrix substrate in accordance with the present embodiment has an arrangement including:

electrode wires constituted by gate electrodes 2 and source electrodes 6 that are arranged in a lattice;

an insulating protection film 8 provided at least on the electrode wires so as to have openings 11a and 11c in predetermined areas on the gate electrodes 2 and source electrodes 6; and a metal layer 12 stacked on the source electrodes 6 in the openings 11a and on the gate electrodes 2 in the openings 11c.

With the arrangement, a metal layer 12 is stacked on the gate electrodes 2 and source electrodes 6. The provision of the metal layer 12 facilitates an attempt to make the gate electrodes 2 and source electrodes 6 thicker and thereby sufficiently reduce the resistance of the electrode wires.

Note that the insulating protection film 8 may only have the openings 11b and 11c (no openings 11a). In other words, the insulating protection film 8 only needs to have openings at least either on the gate electrodes 2 or on the source electrodes 6.

Embodiment 3

Figure 4:
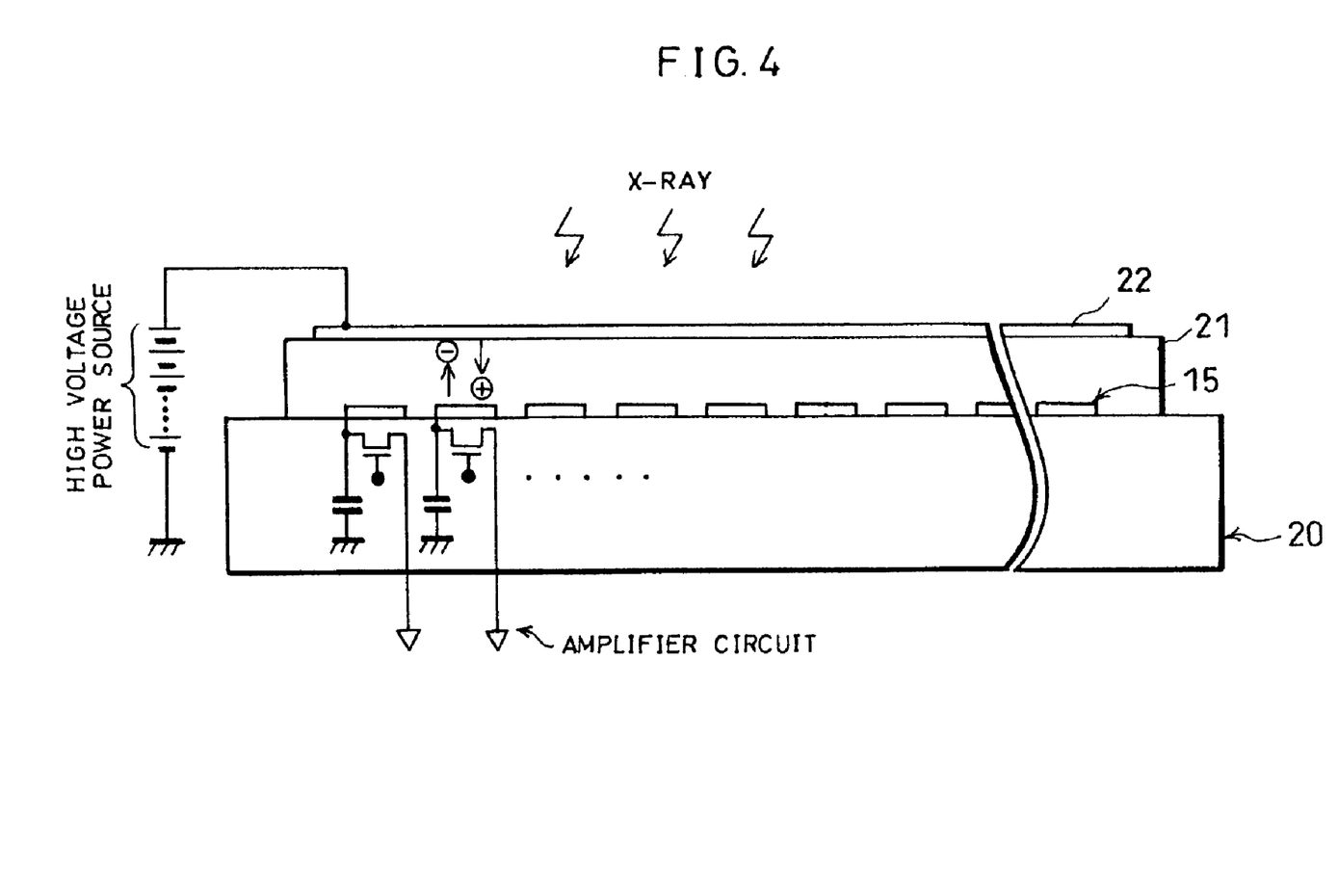
FIG. 4 is a cross-sectional view schematically showing an arrangement of an X-ray sensor (X-ray image-capturing device) incorporating an active matrix substrate in accordance with an embodiment of the present invention.

Referring to FIG. 4, the following description will discuss a further embodiment of the present invention. Here, for convenience, members of the present embodiment that have the same arrangement and function as members of embodiment 1, and that are mentioned in that embodiment are indicated by the same reference numerals and description thereof is omitted.

An image-capturing device in accordance with the present embodiment is an X-ray sensor (X-ray image-capturing device) of a direct conversion type that directly converts X-rays to electric charges using a photoconductor and includes, as shown in FIG. 4, an active matrix substrate 20 manufactured in accordance with embodiment 1 or embodiment 2 and a photoconductor 21 for the active matrix substrate 20 to read electric charges. In other words, an X-ray sensor of a flat panel type in accordance with the present embodiment has photoconductors 21 being stacked on a substantially entire surface of the active matrix substrate 20, i.e., on pixel electrodes 15 provided in great numbers in a matrix form on the active matrix substrate 20, the photoconductors 21 generating electric charges (electron-hole pairs) by absorbing X-rays and includes an arrangement in which there are stacked bias electrodes 22 on the photoconductor 21. A pixel containing layer including pixel electrodes 15 and other elements is designated as a detection area for X-ray images. A high voltage source is electrically connected to the bias electrodes 22. Each one of the source electrodes 6 provided on the active matrix substrate 20 is connected to an external amplifier circuit.

The photoconductor 21 can be made of for instance, semiconductors, such as a-Se (amorphous selenium), CdTe, CdZnTe, $PbI_2$, which are sufficiently sensitive to X-rays and which can be readily formed in a film on a large active matrix substrate. Among them, a-Se is highly absorptive of X-rays with an excellent efficiency in X-ray-to-electric charge conversion and can be directly deposited in a film on an active matrix substrate 20 at relative low temperatures by, for example, vacuum vapor deposition. Acceptable thicknesses of, for example, an a-Se photoconductor 21 are approximately in a range of 500 $\mu$m to 1500 $\mu$m; however, there are no particular requirements.

The bias electrodes 22 can be made of platinum, gold, or ITO, for instance. There are no particular requirements on the method of forming the bias electrodes 22 and their thickness.

Now, the following description will describe driving principles of the X-ray sensor arranged as in the foregoing. As an X-ray is emitted onto the X-ray sensor on the side of the bias electrodes 22, absorption of the X-ray causes the photoconductor 21 to generate electric charges therein (electron-hole pairs). The generated electric charges (holes in the case of FIG. 4) are attracted to the pixel electrodes 15 on the active matrix substrate 20 in the electric field applied to the bias electrodes 22 by the high voltage power source and stored in electric charge storage capacitances 10 connected to the pixel electrodes 15. Then, the gate electrodes 2 on the active matrix substrate 20 are scan driven sequentially one by one to control the ON/OFF of the TFT elements 9. The electric charges stored in the respective electric charge storage capacitances 10 are externally read out as signals via the TFT elements 9 and the source electrodes 6. Thereafter, the readout signals are amplified by the amplifier circuit installed external to the active matrix substrate 20 and extracted as image signals. This way, the two-dimensional distribution of the X-ray absorbed by the X-ray sensor becomes available as image signals.

Generally, in X-ray sensors, a very low quantity of electric charge generated in the photoconductor as a result of X-ray absorption needs to be externally read, while ensuring a sufficient level of S/N ratios. Therefore, demands are high in the source electrodes and other components of the active matrix substrate to sufficiently reduce the resistance thereof to read weak signals generated in the photoconductor. In contrast, in the active matrix substrate 20 manufactured in accordance with embodiment 1 or 2 above, a metal layer 12 is stacked on every source electrode 6, which ensures sufficient reduction in the resistances of the source electrodes 6 and other components. Therefore, those weak signals generated in the photoconductor 21 can be read out, while ensuring a sufficient level of S/N ratios. Also, delays in drive signals can be restrained when an attempt is made to increase the display area (display area size) and precision of the X-ray sensor. In other words, a small quantity of electric charge can be read out, while ensuring a sufficient level of S/N ratios. Also, an X-ray sensor with a large display area and high precision can be provided without causing a delay in the drive signals.

The image-capturing device is not limited only to an X-ray sensor of a direct conversion type arranged as in the foregoing. Alternatively, for instance, the image-capturing device may be an X-ray sensor (X-ray image-capturing device) of an indirect conversion type which includes a fluorescent layer and photoconductor, the fluorescent layer temporarily converting an X-ray into light and the photoconductor converting the light to electric charges.

Embodiment 4

Figure 5:
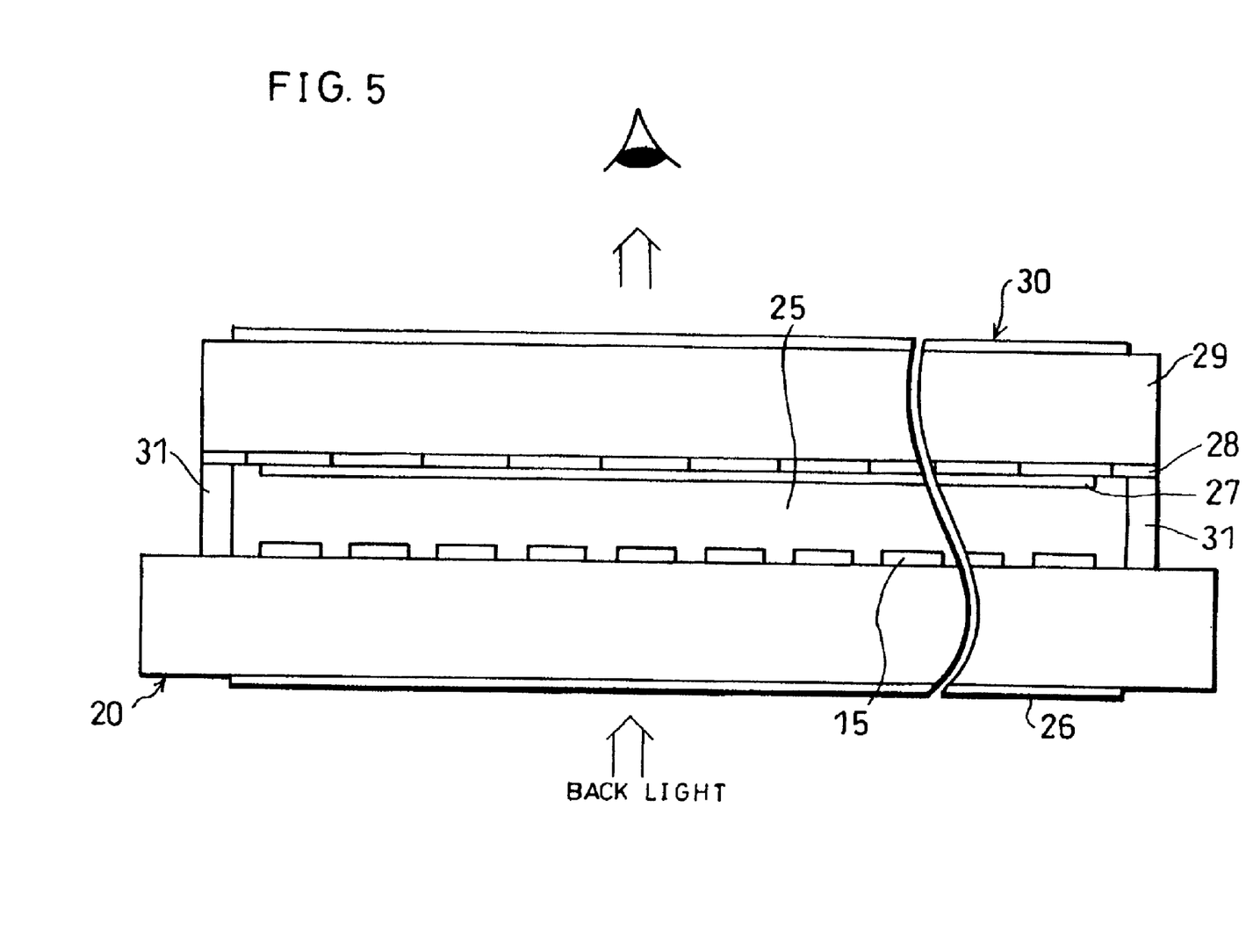
FIG. 5 is an cross-sectional view schematically showing an arrangement of a liquid crystal panel (display device) incorporating an active matrix substrate in accordance with an embodiment of the present invention.

Referring to FIG. 5, the following description will discuss still another embodiment of the present invention. Here, for convenience, members of the present embodiment that have the same arrangement and function as members of embodiment 1, and that are mentioned in that embodiment are indicated by the same reference numerals and description thereof is omitted.

A display device in accordance with the present embodiment is a liquid crystal panel (liquid crystal display device) of a flat panel type and includes, as shown in FIG. 5, an active matrix substrate 20 manufactured either in accordance with embodiment 1 or 2 above, an opposing substrate 29, and a liquid crystal layer 25 filling the gap formed between the two substrates 20 and 29. In other words, the transparent liquid crystal panel in accordance with the present embodiment has a liquid crystal layer 25 being stacked on the substantially entire surface of the active matrix substrate 20, i.e., on pixel electrodes 15 provided in great numbers in a matrix form on the active matrix substrate 20 and acting as electro-optical media driven by the active matrix substrate 20, and includes an arrangement in which there is provided an opposing substrate 29 stacked on the liquid crystal layer 25. The liquid crystal layer 25 is sealed (hermetically encapsulated) by a sealant 31 provided along the edges of the substrates 20 and 29. A pixel containing layer constituted by the pixel electrodes 15 and other elements is designated as an image display area of the liquid crystal panel.

A polarizer plate 26 is provided on the back side of the active matrix substrate 20 (the side opposite to that on which the pixel electrodes 15, etc. are provided). Red, green, and blue (R, G, B) color filters 28 and common electrodes 27 are provided in this order on the opposing surface of the opposing substrate 29 (the side facing the liquid crystal layer). A polarizer plate 30 is provided on the back side of the opposing substrate 29 (the side not facing the liquid crystal layer). A backlight (not shown) is provided at a predetermined position on the back side of the active matrix substrate 20. Light emitted from the backlight (backlight light) passes through the liquid crystal panel and reaches the back side of the opposing substrate 29 to effect various displays. Therefore, the liquid crystal panel has a display screen on the back side of the opposing substrate 29.

Now, the following description will discuss driving principles of the liquid crystal panel arranged as in the foregoing. As the gate electrodes 2 on the active matrix substrate 20 are scan driven sequentially one by one to control the ON/OFF of the TFT elements 9. A voltage is thereby applied across each pixel electrode 15 via the associated TFT element 9 and source electrode 6 according to the display signal. As a voltage is applied across each liquid crystal layer 25 by the associated pixel electrode 15 and common electrode 27 according to a display signal, the backlight light passing through the liquid crystal panel is modulated based on opto-electric characteristics of the liquid crystal. This way, the liquid crystal panel effects an image display based on the display signal.

Generally, the active matrix liquid crystal panel has a problem of losing uniformity in a display due to delays in drive signals and other reasons when it is attempted to enlarge the screen (display area) or improve precision. Therefore, demands are high to achieve a significant reduction in the resistance with gate and source electrodes on the active matrix substrate to restrain the delays in drive signals. In contrast, in the active matrix substrate 20 manufactured in accordance with embodiment 1 or 2 above, a metal layer 12 is stacked on every gate electrode 2 and every source electrode 6, which ensures sufficient reduction in the resistances of the gate and source electrodes 2 and 6 and other components. Therefore, delays in drive signals can be restrained when an attempt is made to increase the display area and precision of the liquid crystal panel; no uniformity is lost in a display. In other words, a liquid crystal panel with a large display area and high precision can be provided without causing a delay in the drive signals.

The display device here is not limited only to those of transparent types and may be, for instance, a display device of a reflection type with pixel electrodes made of a reflective metal. Further alternatives include those with no polarizer plates, such as those employing a guest-host type display scheme or light scattering (diffusion) display scheme. Also, the display device may be electro-optical media that do not use liquid crystal, such as display devices using organic EL (electroluminescent) material, electric migration material, electrochromic material, to name a few examples.

In embodiments 1 to 4, selective formation of metal layers was described as an example of an attempt to increase the thickness of either scanning electrodes or signal electrodes or both on the active matrix substrate by electroless plating or electric plating. These methods are most suitable to simultaneously solve the two problems mentioned earlier in reference to conventional technologies: namely, (1) a typical vacuum film forming device can handle a single wafer at a time and must sacrifice its throughput (performance) to form thicker electrode wires, which brings down the productivity in producing active matrix substrates; and (2) since a metal thin film must be deposited on the entire surface of the substrate before removing unnecessary parts by etching, etching a relatively thick metal film is a time consuming process and produces large amounts of removed waste metal (material).

However, for the purpose of solving only problem (2), the metal layer can be selectively formed by methods other than those introduced in the foregoing. For example, dry film formation techniques, such as CVD, are available.

Specifically, for instance, when the underlying electrodes 6 and 7 are made of TiN, and the overlaying insulating protection film 8 is fabricated from an oxide film, a copper film can be selectively formed only on the exposed parts of the TiN film surface in the openings 11a and 11b which are cut out in the insulating protection film 8 by CVD. Alternatively, by coating the entire surface of the substrate provided with the electrodes 6 and 7 with a surface active agent and then removing the surface active agent selectively only from predetermined areas of the surface of the electrodes 6 and 7 by means of light projection, a copper film can be formed by CVD only in the predetermined areas where the agent is removed.

An active matrix substrate in accordance with the present invention, as described so far, is arranged to include:

an insulating film having openings in predetermined areas either on the scanning electrodes or on the signal electrodes; and a metal layer stacked on the electrodes in the openings. Therefore, it can be attempted to increase the thickness of at least either the scanning electrodes or the signal electrodes, by means of the metal layer. Thereby, active matrix substrates can be made with the resistance of the electrode wires being sufficiently reduced.

An active matrix substrate in accordance with the present invention, as described so far, is arranged so that the metal layer includes at least one kind of metal film selected from the group consisting of a nickel film, a copper film, and a gold film. Therefore, a metal layer can be readily formed with a small specific resistance (low resistance).

An active matrix substrate in accordance with the present invention, as described so far, is arranged so that the metal layer includes a plurality of layers. Therefore, it is readily attempted to increase the thickness of the metal layer.

An active matrix substrate in accordance with the present invention, as described so far, is arranged so that at least either one of the scanning electrodes or the signal electrodes are fabricated from a transparent conducting oxide film. Therefore, the metal layer can be selectively formed only on the transparent conducting oxide film by electroless plating.

An active matrix substrate in accordance with the present invention, as described so far, is arranged so that the insulating film is made of SiNx. Therefore, the catalyst caused to adhere in the formation of a metal layer does not adhere to the SiNx film, and the metal layer can be selectively formed.

An active matrix substrate in accordance with the present invention, as described so far, is arranged so that the metal layer is formed by wet plating. Therefore, the thickness of the metal layer can be readily increased, the throughput (performance) can be prevented from reducing, quantities of wasted metal can be restrained even with a thickened metal layer.

A display device in accordance with the present invention, as described so far, is arranged to include:

an active matrix substrate; and an electro-optical medium driven by the active matrix substrate, the active matrix substrate including: electrode wires constituted by scanning electrodes and signal electrodes that are arranged in a lattice; an insulating film provided at least on the electrode wires so as to have openings in predetermined areas at least either on the scanning electrodes or on the signal electrodes; and a metal layer stacked on the electrodes in the openings. Therefore, a display device with a large display area and high precision can be provided without causing a delay in the drive signals.

A display device in accordance with the present invention, as described so far, is arranged so that the metal layer includes at least one kind of metal film selected from the group consisting of a nickel film, a copper film, and a gold film. Therefore, a metal layer can be readily formed with a small specific resistance (low resistance).

A display device in accordance with the present invention, as described so far, is arranged so that the metal layer includes a plurality of layers. Therefore, it is readily attempted to increase the thickness of the metal layer.

A display device in accordance with the present invention, as described so far, is arranged so that at least either one of the scanning electrodes or the signal electrodes are fabricated from a transparent conducting oxide film. Therefore, the metal layer can be selectively formed only on the transparent conducting oxide film by electroless plating.

A display device in accordance with the present invention, as described so far, is arranged so that the insulating film is made of SiNx. Therefore, the catalyst caused to adhere in the formation of a metal layer does not adhere to the SiNx film, and the metal layer can be selectively formed.

A display device in accordance with the present invention, as described so far, is arranged so that the electro-optical medium is a liquid crystal. Therefore, a liquid crystal panel with large display area and high precision can be provided without causing a delay in the drive signals.

A display device in accordance with the present invention, as described so far, is arranged so that the metal layer is formed by wet plating. Therefore, the thickness of the metal layer can be readily increased, the throughput (performance) can be prevented from reducing, and quantities of wasted metal can be restrained even with a thickened metal layer.

An image-capturing device in accordance with the present invention, as described so far, is arranged so as to include
an active matrix substrate; and
a photoconductor of which electric charge is read by the active matrix substrate
the active matrix substrate including: electrode wires constituted by scanning electrodes and signal electrodes that are arranged in a lattice; an insulating film provided at least on the electrode wires so as to have openings in predetermined areas at least either on the scanning electrodes or on the signal electrodes; and a metal layer stacked on the electrodes in the openings. Therefore, a small quantity of electric charge can be read out, while ensuring a sufficient level of S/N ratios. Also, an image-capturing device with a large display area and high precision can be provided without causing a delay in the drive signals.

An image-capturing device in accordance with the present invention, as described so far, is arranged so that the metal layer includes at least one kind of metal film selected from the group consisting of a nickel film, a copper film, and a gold film. Therefore, a metal layer can be readily formed with a small specific resistance (low resistance).

An image-capturing device in accordance with the present invention, as described so far, is arranged so that the metal layer includes a plurality of layers. Therefore, it is readily attempted to increase the thickness of the metal layer.

An image-capturing device in accordance with the present invention, as described so far, is arranged so that at least either one of the scanning electrodes or the signal electrodes are fabricated from a transparent conducting oxide film. Therefore, the metal layer can be selectively formed only on the transparent conducting oxide film by electroless plating.

An image-capturing device in accordance with the present invention, as described so far, is arranged so that the insulating film is made of SiNx. Therefore, the catalyst caused to adhere in the formation of a metal layer does not adhere to the SiNx film, and the metal layer can be selectively formed.

An image-capturing device in accordance with the present invention, as described so far, is arranged so that the photoconductor is made of amorphous selenium. Therefore, an image-capturing device can be provided with high conversion efficiency in conversion from X-rays to electric charges.

An image-capturing device in accordance with the present invention, as described so far, is arranged so as to include a photoconductor and a luminescent layer. Therefore, an X-ray sensor (X-ray image-capturing device) of an indirect conversion type can be provided in which the fluorescent layer temporarily converting an X-ray into light and the photoconductor converting the light to electric charges.

An image-capturing device in accordance with the present invention, as described so far, is arranged so that the metal layer is formed by wet plating. Therefore, the thickness of the metal layer can be readily increased, the throughput (performance) can be prevented from reducing, and quantities of wasted metal can be restrained even with a thickened metal layer.

A method of manufacturing an active matrix substrate in accordance with the present invention, as described so far, is arranged so as include the steps of:

(a) forming an insulating film having openings in predetermined areas either on the scanning electrodes or on the signal electrodes; and (b) forming a metal layer selectively in the openings on the electrodes. Therefore, an active matrix substrate can be readily manufactured at low cost with the resistance of the electrode wires being sufficiently reduced.

A method of manufacturing an active matrix substrate in accordance with the present invention, as described so far, is arranged so that the metal layer is formed by electric plating. Therefore, the metal layer can be readily formed selectively with no pre-plating steps in which a catalyst is supplied, for example.

A method of manufacturing an active matrix substrate in accordance with the present invention, as described so far, is arranged so that the insulating film is made of SiNx. Therefore, the catalyst caused to adhere in the formation of a metal layer does not adhere to the SiNx film, and the metal layer can be selectively formed.

A method of manufacturing an active matrix substrate in accordance with the present invention, as described so far, is arranged so that the insulating film is made of SiNx, and the metal layer is made of copper. Therefore, the SiNx film is formed first before the formation of the copper film, which does not cause decay of the copper film.

A method of manufacturing an active matrix substrate in accordance with the present invention, as described so far, is arranged so that the metal layer is formed by electroless plating. Therefore, a metal layer can be formed with a uniform thickness even on electrodes provided on a substrate with a large display area. Also, a metal layer can be formed on an isolated pattern.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. An active matrix substrate, comprising:
electrode wires constituted by scanning electrode wiring and signal electrode wiring that are arranged in a lattice;
an insulating film provided at least on the electrode wires so as to have openings in predetermined areas at least either on the scanning electrode wiring or on the signal electrode wiring; and a metal layer in the openings of the insulating film and in contact with the electrode wiring to cap the openings, wherein:

one or more of the openings and the metal layer are provided along substantially the whole length of at least either one of the scanning electrode wiring and the signal electrode wiring.

2. The active matrix substrate as defined in claim 1, wherein the metal layer includes at least one kind of metal film selected from the group consisting of a nickel film, a copper film, and a gold film.

3. The active matrix substrate as defined in claim 1, wherein the metal layer include a plurality of layers.

4. The active matrix substrate as defined in claim 1, wherein at least either the scanning electrode wiring or the signal electrode wiring are fabricated from a transparent conducting oxide film.

5. The active matrix substrate as defined in claim 1, wherein the insulating film is made of SiNx.

6. The active matrix substrate as defined in claim 1, wherein the metal layer is formed by wet plating.

7. The active matrix substrate as defined in claim 1, further comprising:

a storage capacitance electrode for providing a storage capacitance between the storage capacitance electrode and a pixel electrode of a pixel provided for each intersection of the scanning electrode wiring and the signal electrode wiring, wherein:

the storage capacitance electrode is provided apart from the scanning electrode wiring.

8. A display device, comprising:

an active matrix substrate; and an electro-optical medium driven by the active matrix substrate, the active matrix substrate including: electrode wires constituted by scanning electrode wiring and signal electrode wiring that are arranged in a lattice; an insulating film provided at least on the electrode wires so as to have openings in predetermined areas at least either on the scanning electrode wiring or on the signal electrode wiring; and a metal layer in the openings of the insulating film and in contact with the electrode wiring to cap the openings, wherein:

one or more of the openings and the metal layer are provided along substantially the whole length of at least either one of the scanning electrode wiring and the signal electrode wiring.

9. The display device as defined in claim 8, wherein the metal layer includes at least one kind of metal film selected from the group consisting of a nickel film, a copper film, and a gold film.

10. The display device as defined in claim 8, wherein the metal layer include a plurality of layers.

11. The display device as defined in claim 8, wherein at least either the scanning electrode wiring or the signal electrode wiring are fabricated from a transparent conducting oxide film.

12. The display device as defined in claim 8, wherein the insulating film is made of SiNx.

13. The display device as defined in claim 8, wherein the electro-optical medium is a liquid crystal.

14. The display device as defined in claim 8, wherein the metal layer is formed by wet plating.

15. The display device as defined in claim 8, further comprising: a storage capacitance electrode for providing a storage capacitance between the storage capacitance electrode and a pixel electrode of a pixel provided for each intersection of the scanning electrode wiring and the signal electrode wiring, wherein:

the storage capacitance electrode is provided apart from the scanning electrode wiring.

16. An image-capturing device, comprising:

an active matrix substrate; and a photoconductor of which electric charge is read by the active matrix substrate the active matrix substrate including: electrode wires constituted by scanning electrode wiring and signal electrode wiring that are arranged in a lattice; an insulating film provided at least on the electrode wires so as to have openings in predetermined areas at least either on the scanning electrode wiring or on the signal electrode wiring; and a metal layer in the openings of the insulating film and in contact with the electrode wiring to cap the openings, wherein:

one or more of the openings and the metal layer are provided along substantially the whole length of at least either one of the scanning electrode wiring and the signal electrode wiring.

17. The image-capturing device as defined in claim 16, wherein the metal layer includes at least one kind of metal film selected from the group consisting of a nickel film, a copper film, and a gold film.

18. The image-capturing device as defined in claim 16, wherein the metal layer include a plurality of layers.

19. The image-capturing device as defined in claim 16, wherein at least either the scanning electrode wiring or the signal electrode wiring are fabricated from a transparent conducting oxide film.

20. The image-capturing device as defined in claim 16, wherein the insulating film is made of SiNx.

21. The image-capturing device as defined in claim 16, wherein the photoconductor is made of amorphous selenium.

22. The image-capturing device as defined in claim 16, further comprising:

a luminescent layer.

23. The image-capturing device as defined in claim 16, wherein the metal layer is formed by wet plating.

24. The image-capturing device as defined in claim 16, further comprising:

a storage capacitance electrode for providing a storage capacitance between the storage capacitance electrode and a pixel electrode of a pixel provided for each intersection of the scanning electrode wiring and the signal electrode wiring, wherein:

the storage capacitance electrode is provided apart from the scanning electrode wiring.

25. A method of manufacturing an active matrix substrate, comprising the steps of:

(a) forming scanning electrode wiring and signal electrode wiring, for acting as electrode wires, arranged in a lattice on a substrate, further including the sub-steps of:

forming the scanning electrode wiring, and a gate electrode and a storage capacitance electrode of a thin film transistor, on the substrate, and forming the signal electrode wiring, and a source electrode and a drain electrode of the thin film transistor, on the scanning electrode wiring, and the gate electrode and the storage capacitance electrode, via a gate insulating film;

(b) forming an insulating film at least on the electrode wires so as to have openings in predetermined areas of the drain electrode at least either on the scanning electrode wiring or on the signal electrode wiring; and (c) forming a metal layer in the openings of the insulating film and in contact with the electrode wiring to cap the openings, wherein:

one or more of the openings and the metal layer are provided along substantially the whole length of at least either one of the scanning electrode wiring and the signal electrode wiring.

26. The method of manufacturing an active matrix substrate as defined in claim 25, wherein:

the insulating film is made of SiNx.

27. The method of manufacturing an active matrix substrate as defined in claim 25, wherein:

the insulating film is made of SiNx, and the metal layer is made of copper.

28. The method of manufacturing an active matrix substrate as defined in claim 25, wherein:

the metal layer is formed by electric plating.

29. The method of manufacturing an active matrix substrate as defined in claim 25, wherein:

the metal layer is formed by electroless plating.

30. The method of manufacturing an active matrix substrate as defined in claim 25, wherein:

the step (a) includes the sub-steps of:

forming the scanning electrode wiring, and a gate electrode and a storage capacitance electrode of a thin film transistor, on the substrate, and forming the signal electrode wiring, and a source electrode and a drain electrode of the thin film transistor, on the scanning electrode wiring, and the gate electrode and the storage capacitance electrode, via a gate insulating film; and in the step (b), an opening is formed also in a predetermined area of the drain electrode.

31. The method of manufacturing an active matrix substrate as defined in claim 25, wherein:

the step (a) includes the sub-step of:

forming a storage capacitance electrode for providing a storage capacitance between the storage capacitance electrode and a pixel electrode of a pixel provided for each intersection of the scanning electrode wiring and the signal electrode wiring, the storage capacitance electrode being formed to be parallel to the scanning electrode wiring.

32. A method of manufacturing an active matrix substrate comprising the steps of:

(a) forming scanning electrode wiring and signal electrode wiring, for acting as electrode wires, arranged in a lattice on a substrate;

(b) forming an insulating film at least on the electrode wires so as to have openings in predetermined areas at least either on the scanning electrode wiring or on the signal electrode wiring; and (c) forming a metal layer in the openings of the insulating film and in contact with the electrode wiring, wherein:

the opening and the metal layer are provided along substantially the whole length of at least either one of the scanning electrode wiring and the signal electrode wiring.

33. The method of manufacturing an active matrix substrate as defined in claim 32, wherein:

the opening and the metal layer are provided on both of the scanning electrode wiring and the signal electrode wiring.

34. An active matrix substrate comprising:

electrode wires constituted by scanning electrode wiring and signal electrode wiring that are arranged in a lattice;

an insulating film provided at least on the electrode wires so as to have openings in predetermined areas at least either on the scanning electrode wiring or on the signal electrode wiring; and a metal layer in the openings of the insulating film and in contact with the electrode wiring, wherein the opening and the metal layer are provided along substantially the whole length of at least either one of the scanning electrode wiring and the signal electrode wiring.

35. The active matrix substrate as defined in claim 34, wherein:

the opening and the metal layer are provided on both of the scanning electrode wiring and the signal electrode wiring.

36. A display device, comprising:

an active matrix substrate; and an electro-optical medium driven by the active matrix substrate, the active matrix substrate including: electrode wires constituted by scanning electrode wiring and signal electrode wiring that are arranged in a lattice; an insulating film provided at least on the electrode wires so as to have openings in predetermined areas at least either on the scanning electrode wiring or on the signal electrode wiring; and a metal layer in the openings of the insulating film and in contact with the electrode wiring, wherein the opening and the metal layer are provided along substantially the whole length of at least either one of the scanning electrode wiring and the signal electrode wiring.

37. The display device as defined in claim 36, wherein:

the opening and the metal layer are provided on both of the scanning electrode wiring and the signal electrode wiring.

38. An image-capturing device, comprising:

an active matrix substrate; and a photoconductor of which electric charge is read by the active matrix substrate the active matrix substrate including: electrode wires constituted by scanning electrode wiring and signal electrode wiring that are arranged in a lattice; an insulating film provided at least on the electrode wires so as to have openings in predetermined areas at least either on the scanning electrode wiring or on the signal electrode wiring; and a metal layer in the openings of the insulating film and in contact with the electrode wiring, wherein the opening and the metal layer are provided along substantially the whole length of at least either one of the scanning electrode wiring and the signal electrode wiring.

39. The image-capturing device as defined in claim 38, wherein:

the opening and the metal layer are provided on both of the scanning electrode wiring and the signal electrode wiring.

* * * * *